US006268045B1

(12) United States Patent
Leyendecker et al.

(10) Patent No.: US 6,268,045 B1
(45) Date of Patent: Jul. 31, 2001

(54) HARD MATERIAL COATING OF A CEMENTED CARBIDE OR CARBIDE CONTAINING CERMET SUBSTRATE

(75) Inventors: Antonius Leyendecker, Herzogenrath; Oliver Lemmer; Martin Frank, both of Aachen, all of (DE)

(73) Assignee: Cemecon-Ceramic Metal Coatings-Dr.-Ing. Antonius Leyendecker GmbH (DE)

( * ) Notice: Subject to any disclaimer, the term of this patent is extended or adjusted under 35 U.S.C. 154(b) by 0 days.

(21) Appl. No.: 09/355,832

(22) PCT Filed: Feb. 5, 1998

(86) PCT No.: PCT/EP98/00614

§ 371 Date: Aug. 5, 1999

§ 102(e) Date: Aug. 5, 1999

(87) PCT Pub. No.: WO98/35071

PCT Pub. Date: Aug. 13, 1998

(30) Foreign Application Priority Data

Feb. 5, 1997 (DE) .............................................. 197 04 262

(51) Int. Cl.[7] .............................. C23C 16/02; C04B 41/50
(52) U.S. Cl. ............................ 428/216; 51/307; 51/309; 204/298.01; 204/298.02; 427/249; 427/255.1; 427/255.2; 427/255.3; 427/299; 427/314; 427/331; 427/372.2; 427/378; 427/402; 427/419.1; 428/141; 428/323; 428/325; 428/408; 428/469; 428/472
(58) Field of Search ........................ 427/249, 255.1, 427/255.2, 255.3, 299, 314, 331, 372.2, 378, 402, 419.1; 428/216, 325, 323, 469, 472, 141, 408; 51/307, 309; 204/298.01, 298.02

(56) References Cited

U.S. PATENT DOCUMENTS

| 5,370,944 | * | 12/1994 | Omori et al. ..................... 428/565 |
| 5,415,674 |   | 5/1995 | Feistritzer et al. . |
| 5,635,256 | * | 6/1997 | Olson ............................... 51/309 |
| 5,701,578 | * | 12/1997 | Liu .................................. 428/408 |
| 5,955,212 | * | 9/1999 | Matsumoto et al. ............. 427/419.7 |

FOREIGN PATENT DOCUMENTS

| 0 384 011 | 8/1990 | (EP) . |
| 0 396 239 | 11/1990 | (EP) . |
| 0 519 587 | 12/1992 | (EP) . |
| 0 701 006 | 3/1996 | (EP) . |
| 95/15258 | 6/1995 | (WO) . |

OTHER PUBLICATIONS

Nesladek M. et al.: "Adhesion Of Diamond Coatings On Cemented Carbides" Thin Solid Films, vol. 270, No. 1/02, pp. 184–188, Dec. 1, 1995.

* cited by examiner

Primary Examiner—Archene Turner
(74) Attorney, Agent, or Firm—Banner & Witcoff, Ltd.

(57) ABSTRACT

The present invention relates to a component, for example a tool, coated with a hard material, in particular diamond, a process for its production and a device for carrying out the process. The process for the production of the component coated with the hard material comprises the steps of: a) introducing a fine-grained cemented carbide or carbide-containing cement substrate into a vacuum system with a heating device and at least one gas feed connection; b) removing carbon from the carbides of a surface layer of the substrate at a substrate temperature in the region of about 900° C. to about 1400° C. and in an oxygen-containing atmosphere; c) introducing carbon into the surface layer of the substrate at a substrate temperature in the region of about 900° C. to about 1400° C. and in a carbon-containing atmosphere; and d) coating the substrate with the hard material.

31 Claims, 2 Drawing Sheets

HARD MATERIAL COATING OF A CEMENTED CARBIDE OR CARBIDE CONTAINING CERMET SUBSTRATE

The present invention relates to a component coated with a hard material, in particular diamond, for example a tool, to a process for its production and to a device for carrying out the process.

Heavy-duty tools for chip-forming or chipless machining of components to be processed consist of a cemented carbide or cement substrate material and a low-wear hard material layer which is applied to the substrate material.

These substrate materials consist of carbides which may be mixed with for example nitrides or the like and are embedded in a metallic matrix (for example cobalt and/or nikkel and/or iron), for example WC with 0.2 to 20% by weight of Co.

Fine crystalline substances, such as diamond, are used as the material for the layers applied to the substrate material in the case of particularly effective tools. However, it has proved difficult to apply diamond layers of this type with good adhesion to the substrate materials.

A great deal of effort has been made to improve the adhesion of a diamond layer of this type, with a wide variety of solutions having been examined for their effectiveness in improving adhesion.

Thus, EP 0 384 011 A1 and WO 95/15258 propose two quite contrasting solutions.

EP 0 384 011 A1 describes a diamond coating process, with which the existing grain structure of the substrate material is refined by a heat treatment at the surface, in order to promote nucleation for diamond coating at the grain boundaries of the substrate, and thereby to achieve better adhesion of the applied diamond layer.

The starting point is substrates whose grain size is in the region of 1 to 4 $\mu$m. After a heat treatment, a surface layer of the substrate material is produced, which is distinguished by a grain size of about 0.3 $\mu$m, and can thus be termed fine-grained. In order to improve the adhesion, it is proposed to reduce this grain size of the surface layer yet further, since it was assumed that a further reduction in the grain size would lead to an increase in the nucleation. However, the adhesion of the diamond layer in tools produced in this way has not proved satisfactory.

In WO 95/15258, it is proposed to make a mechanical bond between the diamond layer and the substrate surface layer, and to do this, in contradiction to the teaching of the abovementioned EP 0 384 01 A1, by increasing the grain size of the surface layer using a heat treatment.

For this purpose, the starting point is substrate materials which already have a relatively large grain size of 1 to 6 $\mu$m. Satisfactory adhesion of the diamond layer is only achieved for a grain size of the substrate surface layer measuring at least 15 $\mu$m.

However, the disadvantage arises that the large grain size, of more than 15 $\mu$m, for the surface layer of the substrate material permits only a poor quality for the surface of the diamond layer, since the deep structure of the surface layer of the substrate has repercussions on the properties of the applied diamond layer, in particular its surface roughness, and leads to coarsening and forming of burs at for example cutting edges. It must furthermore be taken into account that, in particular when metals are being cut, use is made of substrate materials whose grain sizes are less than 1 $\mu$m. They are distinguished in that the toughness of the substrates increases with decreasing grain size. In particular, grain sizes of as little as 10 to 500 nm can already be produced, and have outstanding material properties for use as cutting tools. Starting substrate materials of this type cannot, according to WO 95/15258, be provided with a diamond coating which adheres satisfactorily.

A further disadvantage results from the process temperature during the heat treatment of the substrates which leads to said grain sizes. The process temperature is in the region of 1500° C.

This high temperature is close to the sintering temperature of customary substrate materials, and therefore has the disadvantage that the tools do not meet the shape and dimensional tolerances for which they were made.

With regard to carrying out a complete process, for example for diamond coating, it has to date been customary to carry out the pretreatment of the substrate and its coating in two different reactors, so that a plurality of devices were needed. As, for example, also in WO 95/15258, the pretreatment required that one of the reactors be configured as a furnace for higher temperatures, or for a wet chemical pretreatment, for example in order to remove the binder from the substrates. It has not to date been possible to carry out all the pretreatment and coating steps for a substrate in one device without conversion.

On the basis of this prior art, the object of the invention is to provide a component, for example a tool, which is provided with a firmly adhering hard material layer, in particular a diamond layer, and which allows the hard material layer to have a high surface quality. The further objects of the invention are to specify a process for producing a component of this type, and to develop a device for carrying out the process.

The invention relates to a component, for example a tool, having an inner cemented carbide or cement substrate material and an outer hard material layer, the grain size of the inner substrate material being less than 1 $\mu$m, the surface layer of the substrate material having a grain size of less than 10 $\mu$m and a surface roughness $R_z$ of less than about 0.7 $\mu$m, and the surface roughness $R_z$ of the hard material layer being less than about 5 $\mu$m, preferably up to 0.3 $\mu$m.

A tool of this type is distinguished in that, for example when metals are being cut, it is possible to employ the customarily used substrate materials with correspondingly small grain size. By providing a surface layer of the substrate material with a grain size of less than 10 $\mu$m, for example up to 1 $\mu$m, this surface layer is provided with a structure that permits mechanical bonding to a hard material layer, for example a diamond layer, in which the grain size of the surface layer generally is higher than the grain size of the inner substrate material.

Besides diamond as the hard material, it is also possible to use materials such as cubic boron nitride, $Al_2O_3$, or other hard materials, such as compounds containing metals of the forth to sixth subgroup of the periodic system, which need mechanical bonding to the surface layer in order to adhere to a substrate.

Besides the bonding of the hard material layer to the surface layer of the substrate, on account of the grain size chosen for the surface layer it is possible for the hard material layer to have a surface roughness with such small values as to permit high-quality processing with tools produced in this way.

The surface layer of the substrate material preferably has a thickness of 1 to 50 $\mu$m, more preferably of 5 to 10 $\mu$m. For values above 10 $\mu$m, a multi-layer structure with a certain grain size can be produced.

In the case of diamond, and also with other coating materials, the hard material layer preferably has a thickness of up to 50 μm, more preferred up to 20 μm and most preferred up to 15 μm. This value depends on the respective application of the component or tool. This thickness relates to the distance of the outer surface of the hard material layer from the surface of the substrate, and does not therefore take into account the proportion of the hard material layer which extends into the substrate.

A suitable process for producing such a tool coated with a hard material comprises the steps of:

a) introducing a fine-grained cemented carbide substrate or carbide-containing cement substrate into a vacuum system with a heating device and at least one gas feed connection;

b) removing carbon from the carbides of the surface layer of the substrate at a substrate temperature in the region of about 900° C. to about 1400° C. and in an oxygen-containing atmosphere; c) introducing carbon into the surface layer of the substrate at a substrate temperature in the region of about 900° C. to about 1400° C. and in a carbon-containing atmosphere; and d) coating the substrate with the hard material.

This process will be explained more precisely below.

After the substrate, which preferably has a grain size of less than 1 μm, has been introduced into the vacuum system, a process step is firstly carried out in which, in a first annealing process, carbon is removed from a surface layer of the substrate, which is for example 1 to 50 μm, preferably 5 to 10 μm thick. For this purpose, the substrate is heated to a temperature in the region of about 900° C. to 1400° C. using the heating device, for example a heating conductor, this temperature being considerably lower than customary sintering temperatures of the above mentioned substrates. Different substrate materials may lead to slightly different temperature ranges. It is thus possible, for example, for the substrate manufactured as a tool to meet the dimensional tolerances intended for its production.

Carbon is removed from the carbides of the surface layer and free carbon that may be present is significantly reduced by the heat treatment of the substrate in the oxygen-containing atmosphere.

For the example of WC in Co as binder, among others the reactions of the following kind take place under the process conditions envisaged:

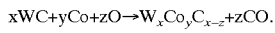

$xWC+yCo+zO \rightarrow W_xCo_yC_{x-z}+zCO$.

The carbon thus reacts to form carbon oxides which leave the surface layer. At the same time, so-called eta phases of WCo double carbides which contain different amounts of the individual elements are formed and, after the end of this process step, grow rich in the surface layer. The form which the surface layer then takes has a very small roughness, which is unsuitable for mechanical bonding to, for example, a layer of diamond, cubic boron nitride, $Al_2O_3$, or compounds containing metals of the forth to sixth subgroup of the periodic system.

In the next process step, which likewise takes place at a low process temperature in comparison with the prior art, for example from WO 95/15258, the surface layer is supplied with carbon in a second annealing process, in which the reaction mentioned above for the example of WC with Co presumably proceeds in reverse, so that a recrystallization process takes place. A one-way physical diffusion process is put in motion, the direction of which is from the finest grains to the larger ones. On account of this, the surface layer of the substrate material undergoes conversion, with the grain size in the region of the surface layer increasing to such an extent as to permit mechanical bonding of this surface layer to a hard material layer.

In a final process step, the hard material is applied to the substrate pretreated in the manner presented above.

The following parameters have been found to be particularly suitable for the process step of removing carbon from the surface layer of the substrate. A fed gas in this step preferably contains about 1 to 3% by volume of $O_2$, it being possible for this gas to be supplied in pure form or by substances which release this gas. In order to provide the $O_2$ in this process step, it is also possible for CO, $CO_2$ or gaseous $C_xH_yO_z$ compounds with $z/x \geqq 1$ to be employed. However, in the case of substances of this type, it is also possible to use powders in which the substrate is packed, for example $TiO_2$, carbonyls or preferably $Al_2O_3$, which are heated to give off oxygen.

Furthermore, the fed gas in this process step preferably contains up to 99% by volume of $H_2$. It has been found that, when this gas is used, the substrate temperature (the term substrate temperature is defined as the inner substrate temperature measured by a thermocouple) for this step is lower, for example equal to 1100° C. or less, than if other gases are used to form the atmosphere.

This may be because atomic hydrogen recombines on the surface of the substrate to form the $H_2$ molecule, with the bond energy of this molecule being released and contributing to heating the substrate surface. It is not, however, necessary to use $H_2$ in order to permit a considerably lower substrate temperature in comparison with the prior art, but rather it is also possible to use other gases which maintain the oxidizing effect, for example noble gases or $N_2$.

For the process step of introducing carbon into the surface layer of the substrate, a fed gas mixture consisting of 99% by volume of $H_2$ and 1% by volume of $CH_4$ is particularly favourable. Instead of methane, it is also possible to use other compounds for providing the required amount of carbon, and for example it is also possible to pack the substrate in graphite powder.

In order to apply a diamond layer to the substrate, the process parameters are set preferably in accordance with the previous process step of supplying carbon to the surface layer, but with the temperature of the substrate in the region of 700 to 1000° C. and a longer duration of this process step.

The total pressure in the vacuum system is preferably in the region of 20 hPa. The total gas flow is in the region of 25 $ml_n$/min per liter of chamber volume.

For the preferred parameter settings which have been mentioned, the process steps b) and c) last about 1 hour. In this case, a thickness for the surface layer in the region of 1 to 50 μm, preferably 5 to 10 μm, is produced at the end of the process step for removing carbon, and a thickness for the diamond layer in the region of 1 to 50 μm, preferably 1 to 20 μm and most preferably 1 to 15 μm is produced at the end of the diamond coating step (lasting typically about 40 hours).

In order to lower the average substrate temperatures during the steps of extracting carbon from and introducing carbon into the substrate material, it is also possible for the substrate layer to be heated separately. This is supported through the use of $H_2$ as a constituent of the atmosphere in this process step.

This process also has the advantage that, in most cases, it is not necessary to have separate etching of the binder phase, formed for example by Co, from the surface layer of the substrate. Nevertheless, the adhesion of the hard material layer may be increased yet further by such etching.

Furthermore, for coating with diamond, the production process does not as a rule require any nucleation process, as is customary and necessary in other processes, but one may nevertheless be carried out in order to increase the adhesion, for example, of a diamond layer.

The process furthermore has the advantage that the process temperatures are kept so low that all the process steps can be carried out in a specially designed CVD coating device which is otherwise primarily used only for the actual coating step.

The invention furthermore relates to a device for carrying out the process described above.

This device for pretreating and diamond-coating a cemented carbide or cement substrate, which has a vacuum chamber, at least one gas feed connection and a heating device, is distinguished in that the heating device comprises a plurality of heating conductors, arranged substantially parallel to one another, which are arranged in at least two essentially mutually parallel planes, and substrate holders for arranging substrates between the planes are provided. For evacuation of the vacuum chamber usually a pump is employed.

A device of this type is suitable for carrying out all the process steps mentioned above.

By arranging the heating conductors in parallel planes, a uniform temperature gradient is ensured between the heating conductors which, depending on the process step which is actually being carried out, are operated at a temperature in the region of about 1000 to about 2800° C., and substrates carried by the substrate holders.

Furthermore, in the case when $H_2$ is used as the process gas, uniform production of H atoms is brought about, so that the recombination of these atoms on the substrate surface is likewise uniform, and constant process conditions are thus achieved over the substrate surfaces.

The distance between the heating conductors and the substrates arranged next to them is in the region of about 3 to 100 mm, preferably 10 mm.

In the case when $H_2$ is used as the process gas a high temperature of the heating conductors can be achieved if they are made of Ta, W, Re or alloys or carbides thereof.

The heating conductors preferably have a diameter of 0.1 to 5 mm, whereas, preferably, the distance between the heating conductors in a plane is in the region of 5 to 50 mm, and the distance of the planes from one another is in the region of 10 to 150 mm.

The heating conductors may be arranged perpendicular or parallel to the substrates. In each case, an adherent coating with hard material is produced, which is distinguished by a high degree of homogeneity.

The parameter settings to be made in respect of the device for carrying out the process steps described above are collated in tables below:

TABLE 1

First anneal

| Parameter | Unit | Typically | Min. | Max. |
|---|---|---|---|---|
| Pressure | hPa | 20 | 1 | 1000 |
| Gas1 $H_2$, Ar, He, $N_2$, noble gases + mixtures thereof | % by volume | 98 $H_2$ | 0 | 99 |
| Gas2 $O_2$, CO, $CO_2$, $H_2O$, $C_xh_yO_z$ with x/z ≤ 1, + mixtures | % by volume | 2 $O_2$ | 1 | 100 |
| Total gas flow per litre of chamber volume | $ml_n$/min/l | 25 | 1 | 100 |
| Substrate temperature | ° C. | 1100 | 900 | 1400 |
| Heating conductor temperature | ° C. | 2000 | 1000 | 2800 |

TABLE 1-continued

First anneal

| Parameter | Unit | Typically | Min. | Max. |
|---|---|---|---|---|
| Substrate-heating conductor distance | mm | 10 | 3 | 100 |
| Duration | h | 1 | 0.1 | 10 |

Instead of gas2, it is also possible to use solids or powders which give off gases at the specified temperature, for example $Al_2O_3$, $TiO_2$, $WO_3$, carbonyls.

TABLE 2

Second anneal

| Parameter | Unit | Typically | Min. | Max. |
|---|---|---|---|---|
| Pressure | hPa | 20 | 1 | 1000 |
| Gas1 $H_2$, Ar, He, $N_2$, noble gases + mixtures thereof | % by volume | 99 $H_2$ | 0 | 99.9 |
| Gas2 $CH_4$, $C_pH_q$, $C_xh_yO_z$ with x/z > 1, + mixtures | % by volume | 1 $CH_4$ | 0.1 | 100 |
| Total gas flow per litre of chamber volume | $ml_n$/min/l | 25 | 1 | 100 |
| Substrate temperature | ° C. | 1200 | 900 | 1400 |
| Heating conductor temperature | ° C. | 2100 | 1000 | 2800 |
| Substrate-heating conductor distance | mm | 10 | 3 | 100 |
| Duration | h | 1 | 0.1 | 10 |

Instead of gas2, it is also possible to use solids or powders which give off carbon, for example graphite etc.

Comments relating to Tables 1 and 2

- Gases within a particular row are given in order of decreasing suitability.
- The device can operate particularly effectively (with little thermal insulation/heating power) if hydrogen is used and the heating-conductor temperature is considerably (>300° C.) higher than the substrate temperature. In such cases, it is possible to do without a vacuum furnace and use normal CVD system.
- The substrate temperature is of prime importance. It can be set by means of the heating-conductor temperature, the substrate-heating conductor distance or pressure.

TABLE 3

Coating

| Parameter | Unit | Typically | Min. | Max. |
|---|---|---|---|---|
| Pressure | hPa | 20 | 1 | 1000 |
| Gas1 $H_2$ | % by volume | 98.9 | 90 | 99.9 |
| Gas2 $CH_4$, $C_pH_q$, $C_xh_yO_z$ with 0,6 ≤x/z ≤ 1,5, + mixtures | % by volume | 1 $CH_4$ | 0.1 | 10 |
| Gas3 $O_2$, CO, $CO_2$, $N_2$, $H_2O$, $C_xH_yO_z$ with x/z ≤ 1, + mixtures | % by volume | 0 | 0% gas2 | 100% gas2 |
| Total gas flow per litre of chamber volume | $ml_n$/min/l | 25 | 1 | 100 |
| Substrate temperature | ° C. | 850 | 600 | 1100 |
| Heating conductor temperature | ° C. | 2000 | 1700 | 2800 |
| Substrate-heating conductor distance | mm | 10 | 3 | 30 |
| Duration | h | 40 | 5 | 200 |

Any other diamond coating process can also be used.

Gases within a particular row are given in order of decreasing suitability.

The extent to which the life of a component produced according to the process, in the case of coating with diamonds, is increased in comparison with conventionally diamond-coated tools will be shown below.

In a tool life test, to be precise in an abrasive jet wear test, in which a jet of abrasive is projected onto a diamond-coated tool, the following results were found for a tool produced according to the process and for a conventionally produced tool (without mechanical bonding):

With the jet parameter settings: nozzle/tool distance 5 mm, nozzle diameter 0.8 mm, jet angle 90°, jet pressure 5 bar, abrasive material SiC, abrasive diameter 75 $\mu$m, jet flow rate 10 g/min, medium air, diamond layer thickness 10 $\mu$m, tool lives until first visible failure of less than 1 s for a conventionally produced tool, and more than 7 min for a tool produced according to the process described here.

The structure of a diamond-coated tool produced according to the process can be seen particularly clearly with the aid of the figures, in which.

Figure 1:
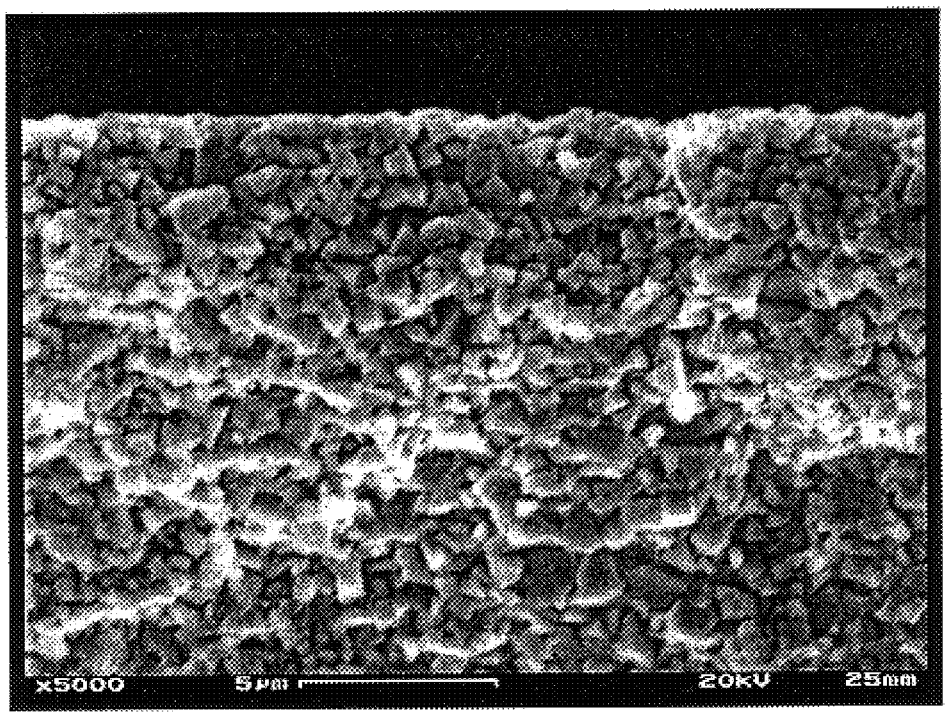
FIG. 1 shows an untreated WC substrate with Co as binder at a magnification of 5000.

FIGS. 1 to 4 show electron-microscopy pictures of the results of the various procedural steps in the process, with a cemented carbide substrate by way of example. The substrate represented in FIG. 1 is a WC substrate with Co as binder material in its initial state, i.e. untreated. The grain size of this substrate is about 0.8 $\mu$m throughout the entire substrate.

Figure 2:
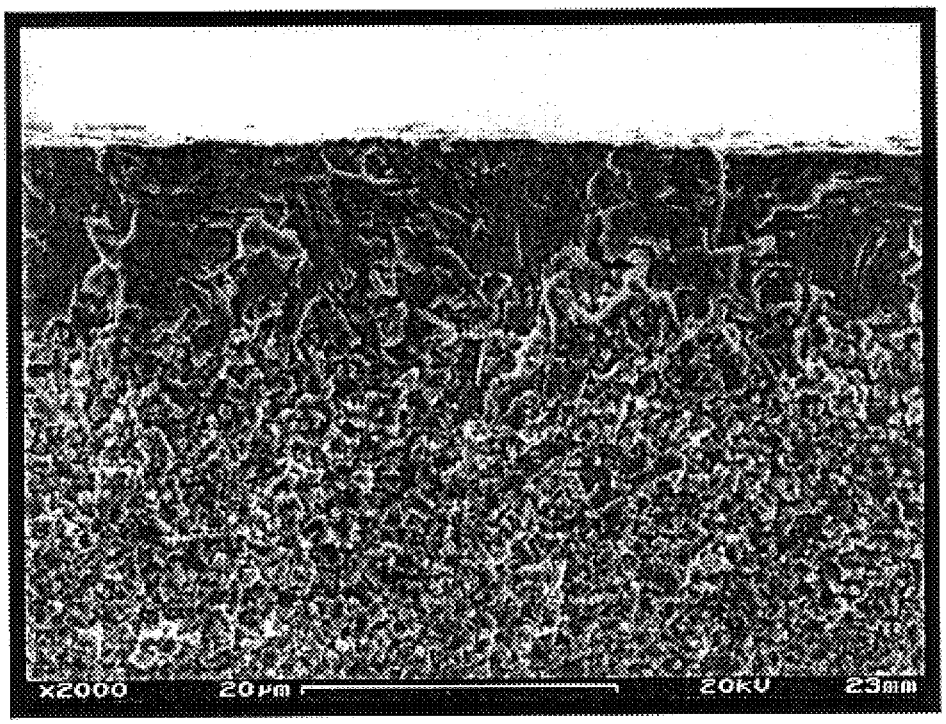
FIG. 2 shows the WC substrate after a first annealing step at a magnification of 2000.

FIG. 2 represents the form of the substrate after the first annealing step for removing free carbon. It is clear to see that the surface layer of the substrate no longer has any visible grain structure, i.e. this layer cannot be bonded mechanically to a diamond layer.

Figure 3:
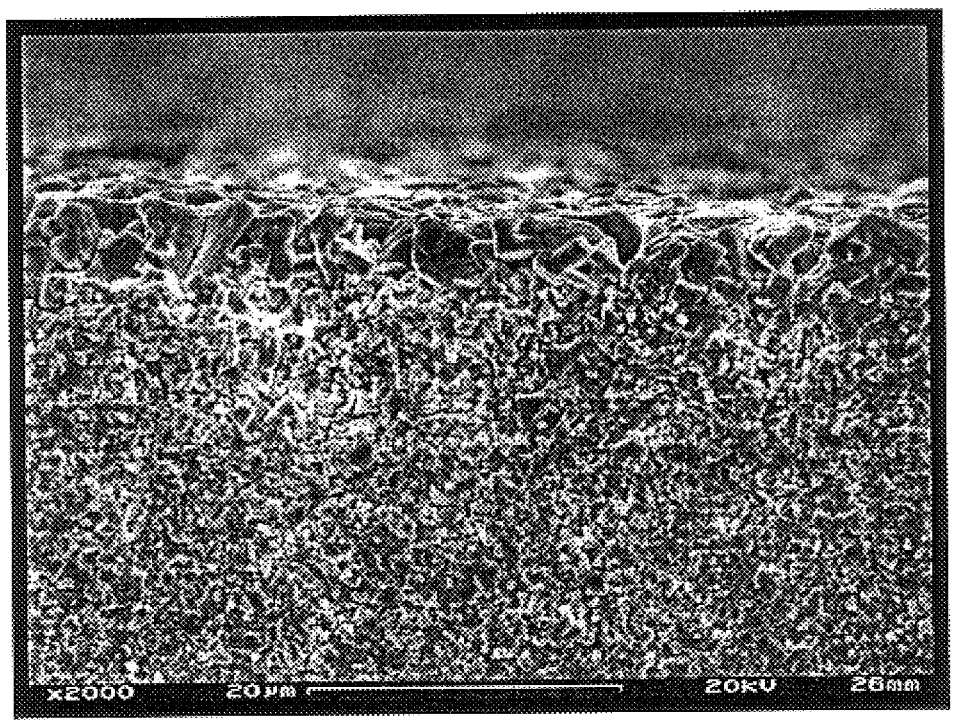
FIG. 3 shows the WC substrate after a second annealing step at a magnification of 2000.

FIG. 3 shows the substrate after the second annealing step for introducing carbon into the surface layer. The surface layer exhibits a coarse grain structure of about 6 $\mu$m, which is highly suitable for mechanical bonding to a diamond layer. The grain size in the inner substrate remains unchanged.

Figure 4:
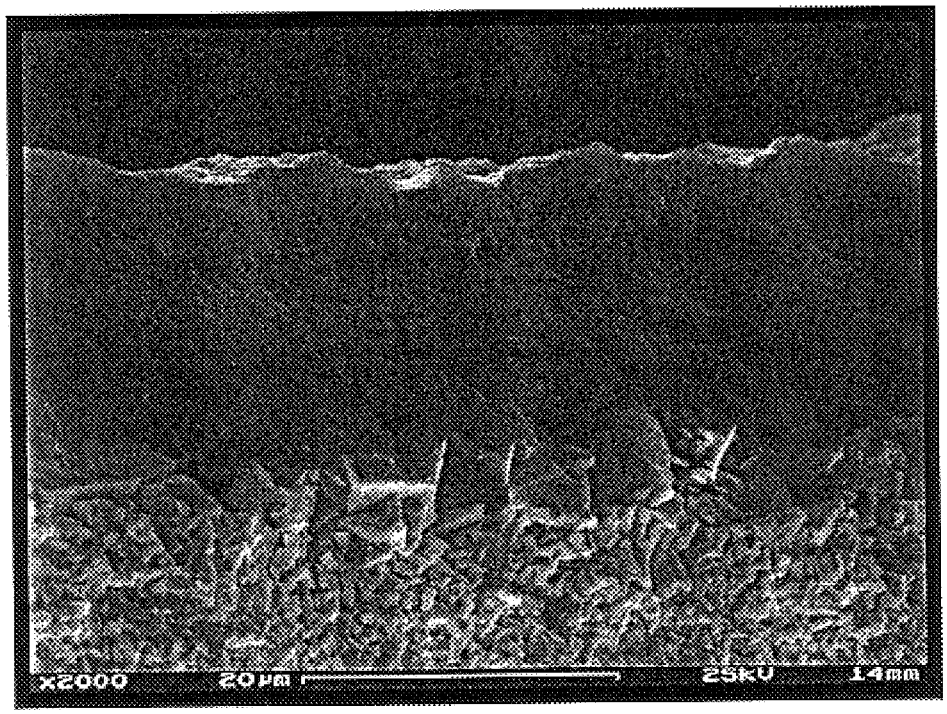
FIG. 4 shows the WC substrate after a diamond-coating step at a magnification of 2000.

FIG. 4 shows the substrate after a diamond-coating process. The bonding of the about 20 $\mu$m thick diamond layer to the about 8 $\mu$m thick substrate surface layer is clear to see.

In order to produce the substrate forms, represented in the figures, after the various process steps, the typical parameter values given in Tables 1 to 3 were set in a CVD coating device according to the invention.

What is claimed is:

1. Process for the production of a component coated with a hard material comprising the steps of:
   a) introducing a fine-grained cemented carbide or carbide-containing cement substrate into a vacuum system with a heating device and at least one gas feed connection;
   b) removing carbon from the carbides of a surface layer of the substrate at a substrate temperature in a range of about 900° C. to about 1400° C. and in an oxygen-containing atmosphere;
   c) introducing carbon into the surface layer of the substrate at a substrate temperature in a range of about 900° C. to about 1400° C. and in a carbon-containing atmosphere so as to increase a grain size of the surface layer relative to a grain size of the substrate; and
   d) coating the substrate with the hard material at a substrate temperature in a range of about 600° C. to 1100° C.

2. Process according to claim 1, wherein the fine-grained substrate has a grain size of less than 1 $\mu$m.

3. Process according to claim 1, characterized in that the hard material is diamond or cubic boron nitride.

4. Process according to claim 1, wherein step b) includes a step of feeding a gas that contains about 1 to 30% by volume of $O_2$ into said vacuum system.

5. Process according to claim 4, wherein, in step b), the fed gas contains about 1 to 3% by volume of $O_2$.

6. Process according to claim 4, wherein, in step b), the remainder of the fed gas consists of $H_2$ and the substrate temperature is in the range of from 1000 to 1200° C.

7. Process according to claim 1, wherein step c) includes a step of feeding a gas that contains about 0.5 to 20% by volume of $CH_4$ into said vacuum system.

8. Process according to claim 7, wherein, in step c), the fed gas contains about 0.5 to 2% by volume of $CH_4$.

9. Process according to claim 7, wherein, in step c), the remainder of the fed gas consists of $H_2$ and the substrate temperature is in the range of about 1100 to 1300° C.

10. Process according to claim 1, wherein, in step d), the substrate temperature is in the range of about 600 to 1100° C. and a fed gas contains about 99% by volume of $H_2$ and 1% by volume of $CH_4$.

11. Process according to claim 1, wherein, in steps b), c) and d), the total pressure in the vacuum system is in a range of about 1 to 1000 hPa.

12. Process according to claim 11, wherein the pressure in the vacuum system is about 20 hPa.

13. Process according to claim 1, wherein, in steps b), c) and d), the total gas flow is in a range of about 1 to 100 ml/min per 1 of chamber volume.

14. Process according to claim 13, wherein the total gas flow per 1 of chamber volume is about 25 ml/min per 1 of chamber volume.

15. Process according to claim 1, wherein, at the end of step b), the thickness of the surface layer is in a range of about 1 to 50 $\mu$m.

16. Process according to claim 1, wherein, at the end of step d), the thickness of the hard material on the substrate is in a range of 1 to 50 $\mu$m.

17. Process according to claim 1, wherein the surface layer of the substrate is heated separately.

18. Process according to claim 1 wherein said component includes a tool.

19. Component having an inner cemented carbide or carbide-containing cement substrate material and an outer hard material layer, wherein the grain size of the inner cement substrate material is less than 1 $\mu$m, a surface layer of the substrate material has a grain size of less than 10 $\mu$m, said grain size of the surface layer of the substrate material is greater than the grain size of the inner cement substrate material, and a surface roughness $R_2$ of less than about 0.7 $\mu$m, and a surface roughness $R_2$ of the hard material layer is less than 5 $\mu$m.

20. Component according to claim 19, wherein the hard material layer is made of diamond.

21. Component according to claim 20, wherein the diamond layer has a thickness of 1 to 50 $\mu$m.

22. Component according to claim 21 wherein the diamond layer has a thickness of about 20 $\mu$m.

23. Component according to claim 19, wherein the surface layer of the substrate material has a thickness of 1 to 20 µm.

24. Component according to claim 23 wherein the surface layer of the substrate material has a thickness of 5 to 10 µm.

25. Component according to claim 22 wherein the diamond layer has a thickness of about 15 µm.

26. Component according to claim 19 wherein said component includes a tool.

27. Device for pretreating and diamond-coating a cemented carbide or carbide-containing cement substrate, said device comprises a vacuum chamber, at least one gas feed connection and a heating device, the heating device comprises a plurality of heating conductors, arranged substantially parallel to one another and in at least two essentially mutually parallel planes, and substrate holders for arranging substrates between the planes are provided.

28. Device according to claim 27, wherein the heating conductors are made of W, Ta, Re or alloys and carbides thereof.

29. Device according to claim 28, wherein the heating conductors have a diameter of 0.1 to 5 mm.

30. Device according to claim 27, wherein the spacing of the heating conductors in a plane is in a range of about 5 to 50 mm.

31. Device according to claim 27, wherein the spacing of the planes is in a range of about 10 to 150 mm.

* * * * *

UNITED STATES PATENT AND TRADEMARK OFFICE
CERTIFICATE OF CORRECTION

PATENT NO.    : 6,268,045 B1
DATED         : July 31, 2001
INVENTOR(S)   : Antonius Leyendecker et al.

It is certified that error appears in the above-identified patent and that said Letters Patent is hereby corrected as shown below:

Title page,
Item [57], ABSTRACT,
Delete "cement" insert -- cermet --

Column 7,
Line 57, delete "cement" insert -- cermet --

Column 8,
Line 6, delete "characterized in that" insert -- wherein --
Line 53, delete "cement" insert -- cermet --

Signed and Sealed this

Seventh Day of January, 2003

JAMES E. ROGAN
*Director of the United States Patent and Trademark Office*